US012082381B2

United States Patent
Yurchenko et al.

(10) Patent No.: US 12,082,381 B2
(45) Date of Patent: Sep. 3, 2024

(54) VAPOR CHAMBER, HEAT SINK, AND TERMINAL

(71) Applicant: Huawei Technologies Co., Ltd., Shenzhen (CN)

(72) Inventors: Denis Yurchenko, Kyiv (UA); Hao Sun, Dongguan (CN); Sergey Khairnasov, Kyiv (UA)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 286 days.

(21) Appl. No.: 17/335,743

(22) Filed: Jun. 1, 2021

(65) Prior Publication Data
US 2021/0289669 A1    Sep. 16, 2021

Related U.S. Application Data

(63) Continuation of application No. PCT/CN2019/105796, filed on Sep. 12, 2019.

(51) Int. Cl.
*H05K 7/20* (2006.01)
*F28F 3/12* (2006.01)

(52) U.S. Cl.
CPC ......... *H05K 7/20809* (2013.01); *F28F 3/12* (2013.01); *H05K 7/20336* (2013.01); *H05K 7/20409* (2013.01); *H05K 7/20418* (2013.01); *F28F 2225/04* (2013.01)

(58) Field of Classification Search
CPC .......... H05K 7/20809; H05K 7/20336; H05K 7/20409; H05K 7/20418; F28F 3/12; F28F 2225/04

USPC .................................................. 361/679.47
See application file for complete search history.

(56) References Cited

U.S. PATENT DOCUMENTS

| 8,018,719 B2 | 9/2011 | Busch | |
|---|---|---|---|
| 2005/0128710 A1* | 6/2005 | Beitelmal | H05K 7/20445 361/709 |
| 2008/0174963 A1* | 7/2008 | Chang | H01L 23/373 361/700 |
| 2009/0040726 A1* | 2/2009 | Hoffman | F28D 15/0233 29/890.032 |
| 2013/0025829 A1* | 1/2013 | Huang | F28D 15/0233 165/104.26 |
| 2018/0066897 A1 | 3/2018 | Lin | |

(Continued)

FOREIGN PATENT DOCUMENTS

| CN | 101232794 A | 7/2008 |
|---|---|---|
| CN | 201706933 U | 1/2011 |

(Continued)

*Primary Examiner* — Zhengfu J Feng
(74) *Attorney, Agent, or Firm* — Conley Rose, P.C.

(57) ABSTRACT

A vapor chamber includes a first base plate (12), a second base plate (13), and a capillary structure (15). The first base plate (12) and the second base plate (13) are disposed in a stacked manner and fastened to each other, and together form a cavity (11). The capillary structure is disposed on an inner wall of the cavity (11) and a surface of at least one support pillar (120) between the first base plate (12) and the second base plate (13), and the capillary structure (15) is configured to provide capillary force for returning liquid to a working medium. A reinforcement table (127) located in the cavity (11) is disposed between the first base plate (12) and the second base plate (13).

26 Claims, 6 Drawing Sheets

(56) References Cited

U.S. PATENT DOCUMENTS

2018/0320997 A1* 11/2018 He .................... F28D 15/0283
2019/0027424 A1    1/2019 Mira et al.
2019/0029106 A1*  1/2019 Lin ......................... C25D 5/34

FOREIGN PATENT DOCUMENTS

| CN | 202514230 U | | 10/2012 | | |
|----|----|----|----|----|----|
| CN | 107557825 A | | 1/2018 | | |
| CN | 107949238 A | * | 4/2018 | ............. | B23P 15/26 |
| CN | 207427663 U | | 5/2018 | | |
| DE | 202007007568 U1 | * | 10/2007 | ............. | B22F 7/064 |

\* cited by examiner

VAPOR CHAMBER, HEAT SINK, AND TERMINAL

CROSS-REFERENCE TO RELATED APPLICATIONS

This is a continuation of Int'l Patent App. No. PCT/CN2019/105796, filed on Sep. 12, 2019, which is incorporated by reference.

FIELD

This disclosure relates to the field of heat dissipation technologies, and in particular, to a vapor chamber, a heat sink, and a terminal.

BACKGROUND

An electronic product generates heat during working. If the heat does not dissipate in time but accumulates inside the electronic product, a temperature of the electronic product increases. This affects performance of the electronic product, and in a serious case, may cause a fault and damage to the electronic product. Therefore, the industry has been researching and developing various heat dissipation solutions for the electronic product to solve a heat dissipation problem of the electronic product.

In the industry, a heat sink for dissipating heat for a device that emits a large amount of heat, for example, a central processing unit (CPU), is usually classified into a profile radiator, a heat pipe (special) radiator, a vapor chamber (VC) heat sink, and other two-phase heat sinks. The VC heat sink uses a vapor chamber as a base plate of the heat sink. Usually, uniform temperature of the base plate can be within 5 degrees Celsius (° C.). Therefore, heat dissipation performance of the VC heat sink is better than that of other types of heat sinks. The VC heat sink is widely used in some electronic products that require fast heat dissipation. During application, a selected heat sink needs to meet heat dissipation performance and rigidity requirements, to prevent the heat sink from being deformed and/or damaged in use. However, the VC has a cavity structure and is limited in some terminals that have a high rigidity requirement.

SUMMARY

A technical problem to be resolved is to provide a vapor chamber, a heat sink, and a terminal that can improve rigidity.

To achieve the foregoing objective, the embodiments use the following technical solutions.

According to a first aspect, an embodiment provides a vapor chamber, including a first base plate, a second base plate, and a capillary structure, where the first base plate and the second base plate are disposed in a stacked manner and fastened to each other, and together form a cavity by enclosing, the cavity is configured to accommodate a working medium, a plurality of support pillars are disposed between the first base plate and the second base plate, the capillary structure is disposed on an inner wall of the cavity and an surface of at least one support pillar, the capillary structure is configured to provide capillary force for returning liquid to the working medium, and a reinforcement table located in the cavity is further disposed between the first base plate and the second base plate.

A working principle of the vapor chamber includes four steps: conduction, evaporation, convection, and condensation. Heat enters the cavity from an external high temperature area through heat conduction. After being absorbed by a working medium near a heat source, the heat is rapidly vaporized, and a large amount of heat is taken away. By utilizing a latent heat property of vapor, when the vapor in a plate diffuses from a high-pressure area (namely, a high-temperature area) to a low-pressure area (namely, a low-temperature area), the vapor is condensed into liquid and rapidly releases heat when the vapor is in contact with an inner wall with lower temperature. A condensed liquid working medium returns to the heat source through the capillary force of the capillary structure. In this way, a heat conduction cycle is completed.

According to the vapor chamber provided in this implementation, the heat source is attached to a side, of the first base plate, away from the second base plate during use. Because the reinforcement table is disposed between the first base plate and the second base plate, rigidity of the vapor chamber is improved. In this way, the vapor chamber still has a relatively high rigidity when a thickness of the vapor chamber in a stacking direction of the first base plate and the second base plate is relatively small, so that relatively large acting force from the heat source can be borne, to reduce a possibility that the vapor chamber is deformed and/or damaged, prolong a service life of the vapor chamber, and facilitate lightness and thinness of the vapor chamber. The heat source is an electronic component that can generate heat during working, for example, a chip. The chip includes a central processing unit.

In an implementation, the first base plate includes a plate body and an outer frame, the outer frame is convexly disposed on an edge of the plate body in a direction that the first base plate faces the second base plate, the outer frame is disposed around the edge of the plate body, the capillary structure is disposed on a surface, of the plate body, facing the second base plate, and the reinforcement table is convexly disposed on the surface, of the plate body, facing the second base plate. In this implementation, the outer frame is disposed around the plate body, to further improve rigidity of the first base plate and the vapor chamber.

In an implementation, the plate body extends in a first direction and a second direction perpendicular to the first direction, the reinforcement table is located between a central position and the outer frame, and the reinforcement table is located on an axis that passes through the central position of the plate body and extends in the first direction. Because the reinforcement table is located on the axis that passes through the central position of the plate body and extends in the first direction, in other words, the reinforcement table is disposed in a middle part that is of the plate body and that is relatively weak, strength of the middle part of the plate body is improved.

In an implementation, the first base plate includes a first area and a second area connected to the first area, the first area is configured to dispose a heat source, the plurality of support pillars are distributed on the first area and the second area, and the reinforcement table is located on the second area. Because the reinforcement table is disposed away from the first area, in other words, disposed away from a high temperature area in which the vapor chamber works, the reinforcement table does not affect circulation of the heat generated by the heat source in the cavity while improving the rigidity of the vapor chamber, to ensure heat dissipation performance of the vapor chamber.

In an implementation, the plate body includes a first area and a second area disposed around the first area, the reinforcement table is disposed on the second area, the central position is located in the first area, and the plate body extends in a first direction. The first direction is perpendicular to the stacking direction of the first base plate and the second base plate, and the reinforcement table is located on the axis that passes through the central position of the plate body and extends in the first direction.

In an implementation, the first area is an area occupied by a circle whose circle center is the central position of the plate body and whose radius is a preset radius. The preset radius is less than half of a width of the plate body in the first direction.

In this implementation, the preset radius may be a radius of a force-applying part in a rigidity testing device. In other words, the first area is an area in which the plate body is in contact with the force-applying part in a rigidity test.

In an implementation, the reinforcement table is fastened to the outer frame, so that support stability of the outer frame is improved, and the rigidity of the first base plate and the vapor chamber is also improved.

In an implementation, a width of the reinforcement table decreases from an end, of the reinforcement table, fastened to the outer frame to a center of the plate body, to reduce impact on heat circulation in the cavity.

In an implementation, the reinforcement table is connected to the first base plate and the second base plate, to further strengthen the rigidity of the vapor chamber.

In an implementation, a groove is disposed on an outer wall of the reinforcement table. In this way, the reinforcement table has the capillary force, to improve a liquid returning capability of the vapor chamber to the working medium.

In an implementation, the first base plate further includes the plurality of support pillars convexly disposed towards the second base plate, the capillary structure includes a first capillary layer, a second capillary layer, and a plurality of powder rings, the first capillary layer is attached to a surface, of the first base plate, facing the second base plate, and each powder ring is sleeved on one support pillar.

In this implementation, because the capillary structure is disposed on the first base plate, the second base plate, and the support pillar, the liquid returning capability of the vapor chamber is improved, and the heat dissipation performance of the vapor chamber is also improved.

In an implementation, the plurality of support pillars are arranged in a plurality of columns on the surface, of the first base plate, facing the second base plate, and in every two adjacent columns of support pillars, the powder rings are sleeved on at most one column of support pillars. The more the capillary structure is disposed in the cavity, the higher thermal resistance of the vapor chamber is to some extent. Therefore, the heat dissipation performance of the heat sink is reduced. In this implementation, in every two adjacent columns of support pillars, the powder rings are sleeved on at most one column of support pillars. In other words, the powder rings in the cavity are arranged at intervals, so that the thermal resistance of the vapor chamber can be reduced.

In an implementation, a thickness range of the vapor chamber in the stacking direction of the first base plate and the second base plate is 2.5 millimeters (mm) to 4.5 mm, to effectively reduce space occupied by the vapor chamber.

According to a second aspect, an implementation further provides a heat sink, including the vapor chamber described above and heat sink fins. The heat sink fins are fastened to a side, of the second base plate, away from the first base plate.

According to the heat sink provided in this implementation, because a reinforcement table is disposed between the first base plate and the second base plate of the vapor chamber, rigidity of the first base plate and the vapor chamber is improved, so that relatively large acting force from a heat source can be borne, to reduce a possibility that the vapor chamber is deformed and/or damaged, prolong a service life of the vapor chamber, and help to reduce the thickness of the vapor chamber in a stacking direction of the first base plate and the second base plate.

According to a third aspect, an implementation further provides a terminal, including a housing, a heat source, and the heat sink described above. The heat sink and the heat source are disposed on the housing, and the heat source is attached to a side, of the first base plate, away from the second base plate.

In the terminal provided in this implementation, because a reinforcement table is disposed between the first base plate and the second base plate, the reinforcement table may also have relatively good rigidity performance under a relatively small thickness of the vapor chamber, so that the vapor chamber can be well applied to a terminal with a relatively small size or with fast heat dissipation.

In an implementation, the terminal is a server, and the heat source is a chip.

In an implementation, a height of the server is 44.5 mm, a thickness of the vapor chamber in a stacking direction of the first base plate and the second base plate is 3 mm, and a height of heat sink fins is 22.0 mm, which is far higher than a height of heat sink fins (usually 20.5 mm) of an existing VC heat sink. Because the height of the heat sink fins is increased, the heat dissipation performance of the heat sink is also effectively improved. For example, in a 1288V5 system configured with a 205 W CPU, tested temperature is reduced by about 1.8° C. Compared with the existing heat sink, the heat dissipation performance of the heat sink is improved by 4%.

DETAILED DESCRIPTION

Figure 1:
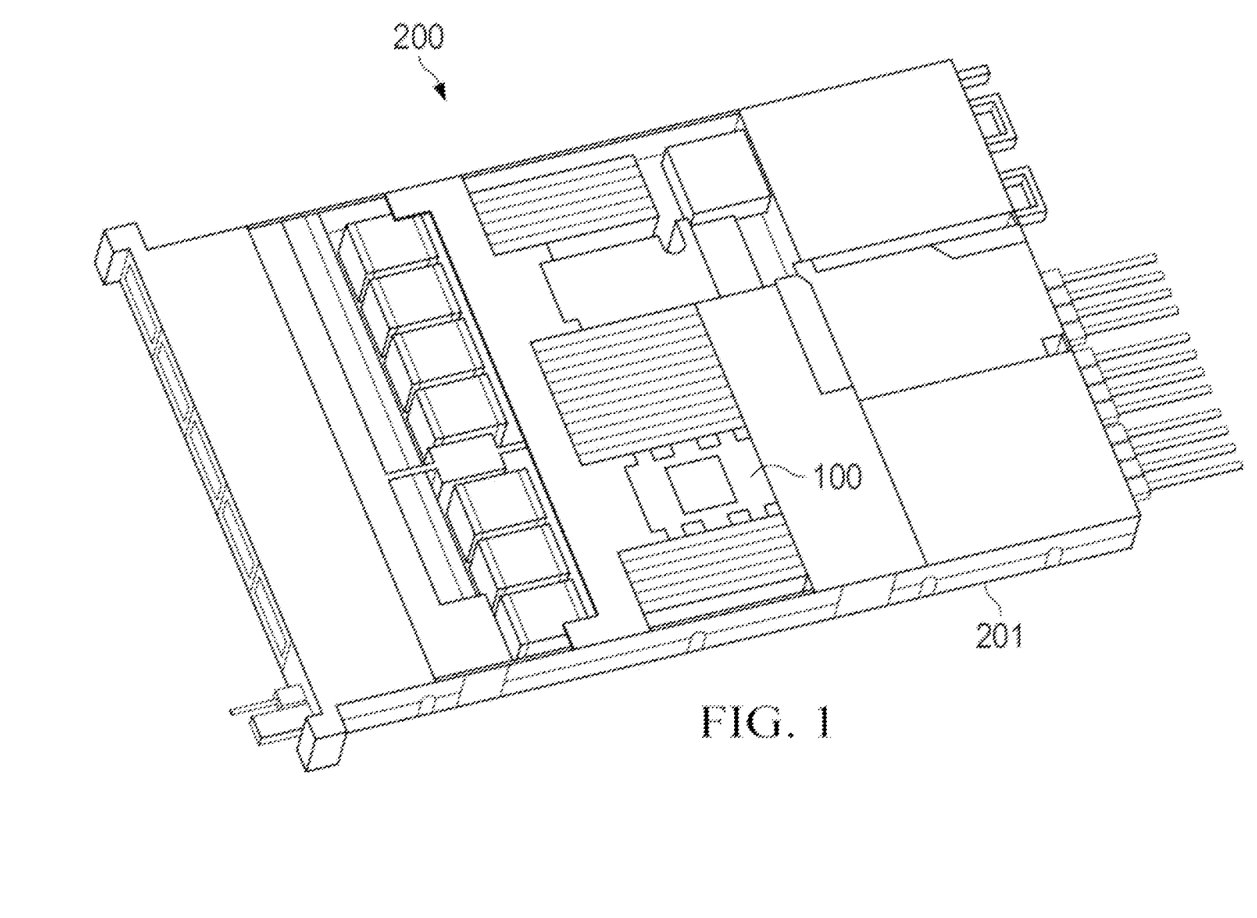
FIG. 1 is a schematic diagram of a partial structure of a terminal according to a first implementation.
Figure 2:
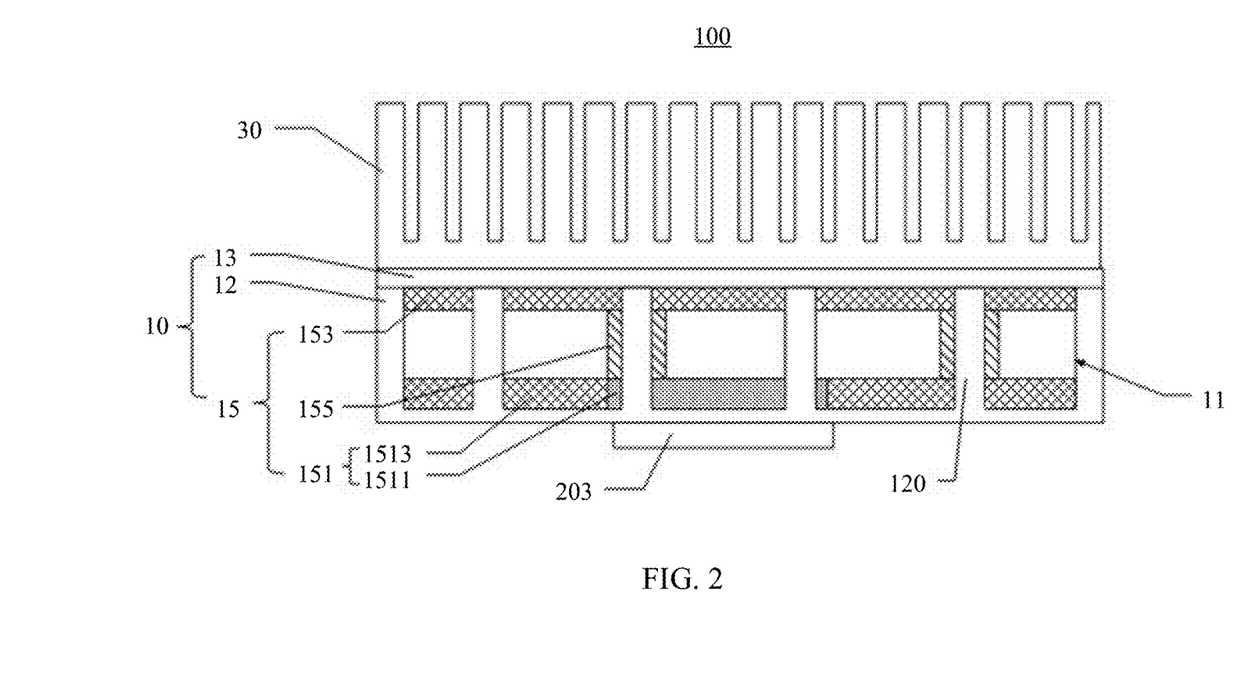
FIG. 2 is a sectional view of assembling a heat sink and a heat source that are of a terminal according to a first implementation.

FIG. 1 is a schematic diagram of a partial structure of a terminal according to a first implementation. A terminal 200 includes a housing 201 and a heat sink 100 disposed on the housing 201. FIG. 2 is a sectional view of assembling a heat sink and a heat source that are of a terminal according to a first implementation. The terminal 200 further includes a heat source 203 disposed in the housing 201, and the heat sink 100 is configured to dissipate heat generated when the heat source 203 works. The heat source 203 is an electronic component that can generate heat during working.

In this implementation, the terminal 200 is a 1 U server. The "1 U server" is a product whose appearance meets the specifications of the Electronic Industries Alliance (EIA) and whose thickness is about 4.45 centimeters (cm). A server that can be installed in a 19-inch cabinet is usually referred to as a rack server. The heat source 203 is a chip, and the heat source 203 includes a central processing unit. It may be understood that the terminal 200 is not limited to the 1 U server in this implementation, the terminal 200 may be a server or a device of another height, the heat source 203 is not limited to a chip, and the heat source 203 may also be another electronic component that can generate heat during working.

The heat sink 100 includes a vapor chamber 10 and heat sink fins 30. The vapor chamber 10 has a cavity 11, and a capillary structure 15 is disposed on an inner wall of the cavity 11. The cavity 11 is configured to accommodate a working medium (not shown in the figure). In this implementation, the working medium is water. The capillary structure 15 is configured to conduct heat to the working medium, absorb the working medium, and provide capillary force for returning liquid to the working medium. It may be understood that the working medium is not limited to the water, and the working medium may also be another medium that can perform a gas-liquid change. It may be understood that there may be one cavity 11, two cavities 11, three cavities 11, or more than three cavities 11, and a plurality of cavities 11 may be arranged in an array manner, to implement heat dissipation for a plurality of heat sources 203 at the same time.

The vapor chamber 10 further includes a first base plate 12 and a second base plate 13 that are disposed in a stacked manner and fastened to each other, and the first base plate 12 and the second base plate 13 together form the cavity 11 by enclosing. A plurality of support pillars 120 connected to the second base plate 13 are convexly disposed on a side, of the first base plate 12, facing the second base plate 13, and are configured to support the capillary structure 15. The heat sink fins 30 are fastened to a side, of the second base plate 13, away from the first base plate 12. The heat source 203 is attached to a side, of the first base plate 12, away from the second base plate 13. In this implementation, the first base plate 12 and the second base plate 13 are made of a metal copper material with relatively good heat dissipation performance. It may be understood that the first base plate 12 and the second base plate 13 are not limited to be made of the metal copper material, or may be made of another material, for example, a copper alloy.

The capillary structure 15 includes a first capillary layer 151, a second capillary layer 153, and a plurality of powder rings 155. The first capillary layer 151 is attached to a surface, of the first base plate 12, facing the second base plate 13. The first capillary layer 151 includes an evaporation area 1511 and a delivery area 1513 connected to the evaporation area 1511. The evaporation area 1511 corresponds to a high temperature area generated by the heat source 203 that is heat-conducted to the first base plate 12. The second capillary layer 153 is attached to a side, of the second base plate 13, facing the first base plate 12. The powder ring 155 is ring-shaped, and each powder ring 155 is sleeved on one support pillar 120. The first capillary layer 151, the second capillary layer 153, and the plurality of powder rings 155 are obtained by sintering metal powder or metal meshes with different particle sizes. In this implementation, the capillary structure 15 is obtained by sintering copper powder or a copper mesh.

A working principle of the vapor chamber 10 is as follows: Heat generated by the heat source 203 is conducted to the evaporation area 1511 through the first base plate 12, and the working medium in the evaporation area 1511 absorbs the heat and is vaporized into vapor. When the vapor reaches the second capillary layer 153, the vapor is condensed into liquid to release the heat, and the heat released by condensation of the vapor is conducted through the second base plate 13 to the heat sink fins 30 to be dissipated. The working medium condensed by the vapor flows back to the evaporation area 1511 of the first capillary layer 151 under an action of capillary force of the powder ring 155 and the delivery area 1513 of the first capillary layer 151, and performs a next cycle, to achieve a fast temperature uniformity effect.

It may be understood that a liquid injection port (not shown in the figure) may be disposed on at least one of the first base plate 12 and the second base plate 13, to facilitate injection of the working medium. The cavity 11 is vacuumized, and after the working medium is injected, the liquid injection port is closed, so that the cavity 11 becomes a closed cavity.

Figure 3:
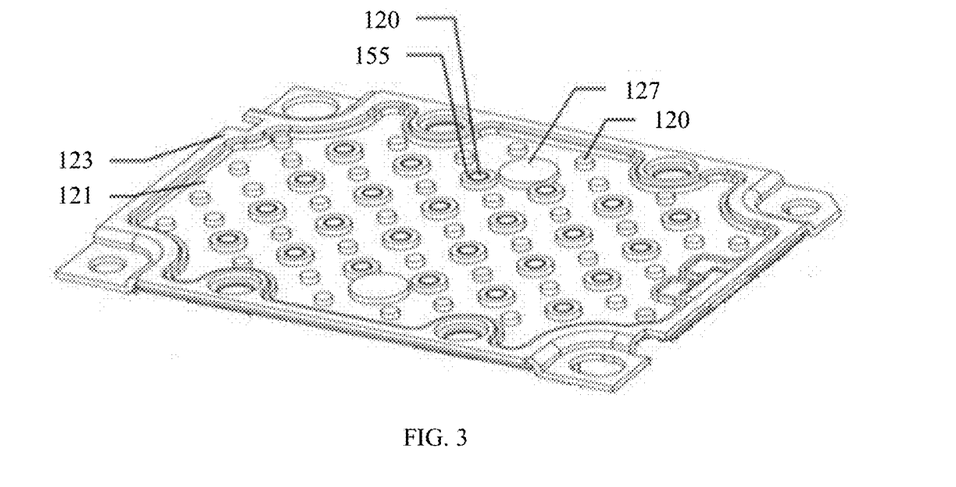
FIG. 3 is a schematic three-dimensional diagram of a first base plate of the heat sink shown in FIG. 2.

FIG. 3 is a schematic three-dimensional diagram of a partial structure of the heat sink shown in FIG. 2. The first base plate 12 further includes a plate body 121, an outer frame 123, and a reinforcement table 127.

The outer frame 123 convexly disposed on an edge of the plate body 121 in a direction in which the first base plate 12 faces the second base plate 13, and the outer frame 123 is disposed around the edge of the plate body 121, to strengthen rigidity of the first base plate 12. The outer frame 123 is fastened to the second base plate 13.

The plurality of support pillars 120 are convexly disposed on a surface, of the plate body 121, facing the second base plate 13. The support pillar 120 is approximately cylindrical, and the support pillar 120 is connected to the second base plate 13. It may be understood that a shape of the support pillar 120 is not limited, and the support pillar 120 may also be in another shape, for example, a square column. Alternatively, the support pillar 120 may not be connected to the second base plate 13. The more the capillary structure is disposed in the cavity, the higher thermal resistance of the vapor chamber is to some extent. Therefore, heat dissipation performance of the heat sink is reduced. The plurality of support pillars 120 are arranged in a plurality of columns, and in every two adjacent columns of support pillars 120, the powder rings 155 are sleeved on at most one column of support pillars 120. Because the powder rings 155 inside the cavity 11 are arranged at intervals, the thermal resistance of the vapor chamber 10 can be reduced. It may be understood that the capillary structure is disposed on at least one support pillar 120.

The reinforcement table 127 is spaced by the plurality of support pillars 120 and convexly disposed on the surface, of the plate body 121, facing the second base plate 13, to strengthen the rigidity of the vapor chamber 10. The rigidity refers to an ability of a material or structure to resist elastic deformation under stress, and represents a difficulty degree of the elastic deformation of the material or structure. The side, of the first base plate 12, away from the second base plate 13 is attached to the heat source 203 during use. Because the reinforcement table 127 is convexly disposed on the surface, of the first base plate 12, facing the second base plate 13, rigidity of the first base plate 12 is improved.

In this way, greater acting force from the heat source 203 can be borne, a possibility of deformation and/or damage of the vapor chamber 10 is reduced, and a service life of the vapor chamber 10 is prolonged.

In this implementation, the reinforcement table 127 is approximately cylindrical, and a diameter of the reinforcement table 127 is greater than a diameter of the support pillar 120. It may be understood that a shape of the reinforcement table 127 is not limited to a cylindrical shape, and the reinforcement table 127 may also be in another shape, for example, a square column. The diameter of the reinforcement table 127 is not limited to be greater than the diameter of the support pillar 120. A height of the support pillar 120 and a height of the reinforcement table 127 are not limited.

Figure 4:
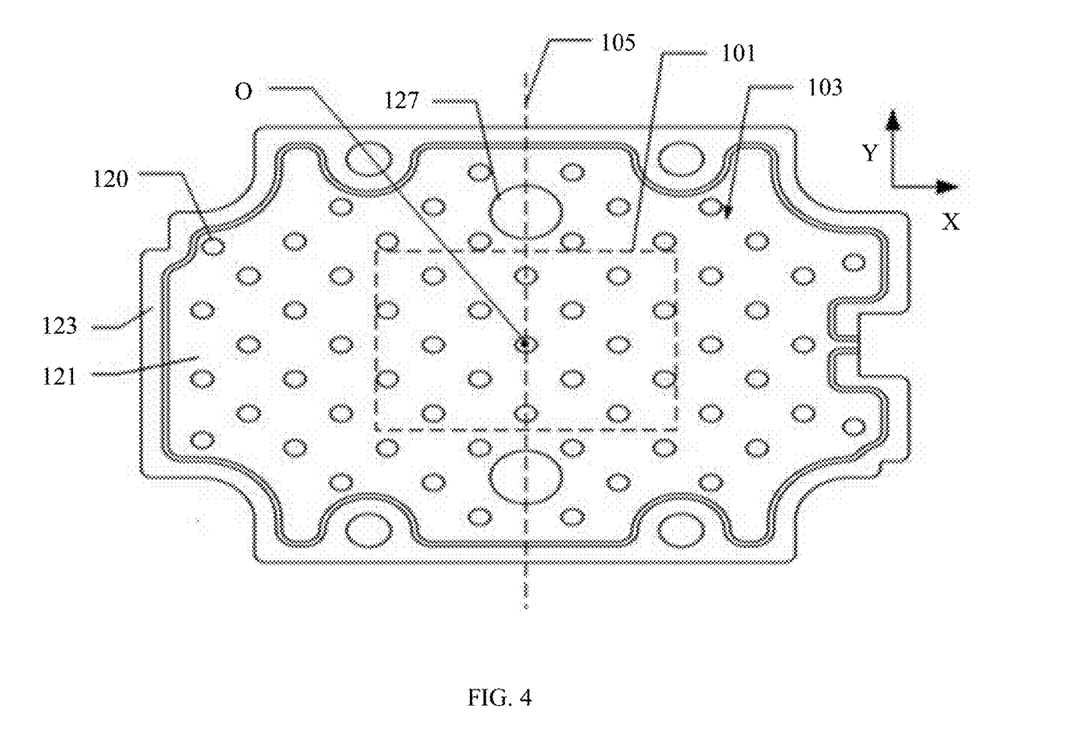
FIG. 4 is a schematic planar diagram of a first base plate of the heat sink shown in FIG. 3.

FIG. 4 is a schematic planar diagram of a first base plate of the heat sink shown in FIG. 3. The plate body 121 extends in a first direction (for example, a Y direction shown in FIG. 4) and a second direction (for example, an X direction shown in FIG. 4) perpendicular to the first direction. The plate body 121 has a central position O, and the reinforcement table 127 is located between the outer frame 123 and the central position O. The reinforcement table 127 is located on an axis 105 that passes through the central position O of the plate body 121 and extends in the first direction. Because the reinforcement table 127 is located on the axis 105 that passes through the central position O of the plate body 121 and extends in the first direction, rigidity and strength of the plate body 121 in the first direction are enhanced. In an embodiment, the reinforcement table 127 is disposed on an area in which stress of the plate body 121 is relatively weak, to improve the rigidity of the vapor chamber 10 from the area in which the stress of the plate body 121 is relatively weak.

The plate body 121 includes a first area 101 and a second area 103 disposed around the first area 101. The central position O is located in the first area 101. The plurality of support pillars 120 are distributed on the first area 101 and the second area 103. The first area 101 is configured to dispose the heat source 203. For example, the first area 101 is an area occupied when the vapor chamber 10 is attached to the heat source 203 during use. The reinforcement table 127 is disposed on the second area 103 away from the heat source 203, to avoid, while improving the rigidity of the vapor chamber 10, that the heat generated by the heat source 203 is obstructed in circulation in the cavity 11, and that heat dissipation efficiency of the heat sink 100 is affected.

In an implementation, there is no limitation on disposition of the second area 103 around the first area 101, the plate body 121 includes the first area 101 and the second area 103 that is connected to the first area 101, the first area 101 is configured to dispose the heat source 203, the plurality of support pillars 120 are distributed on the first area 101 and the second area 103, and the reinforcement table 127 is located on the second area 103. The heat source 203 is usually attached to the first base plate 12 at the central position corresponding to the plate body 121. The reinforcement table 127 is disposed away from the first area 101 to avoid a high temperature area in which the vapor chamber 10 works, so that the reinforcement table 127 improves the rigidity of the vapor chamber 10, does not affect the circulation of the heat generated by the heat source 203 in the cavity, and ensures heat dissipation performance of the vapor chamber 10.

It may be understood that the plate body 121, the support pillar 120, and the reinforcement table 127 may be integrally disposed, or may be separately prepared.

Figure 5:
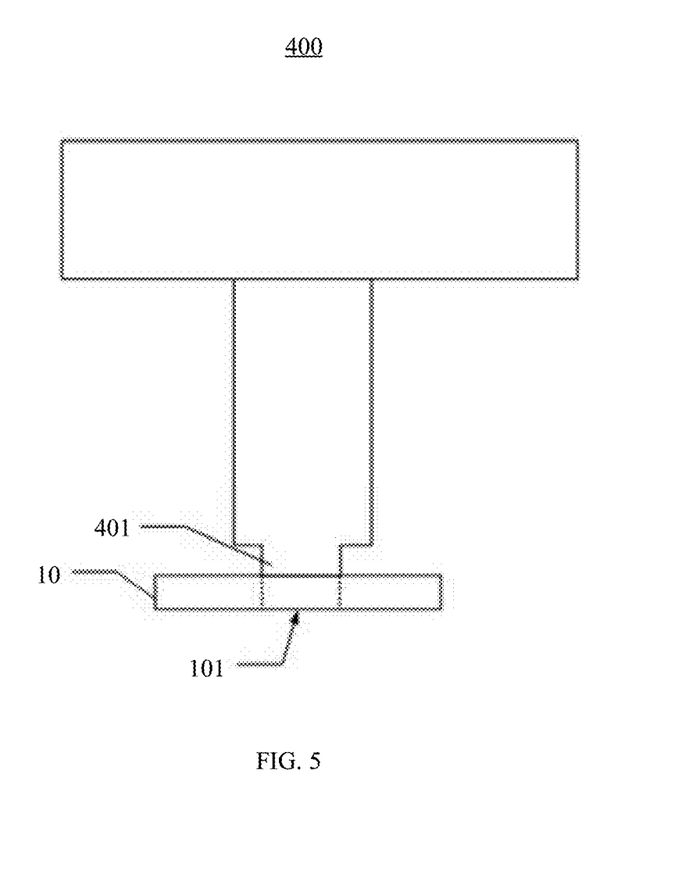
FIG. 5 is a schematic diagram of performing a rigidity test on a vapor chamber by a rigidity testing device.

During application, the heat source 203 is usually attached to the heat sink 100, and the heat sink 100 needs to bear acting force from the heat source 203. For example, when the heat source 203 is a chip that needs to abut against a pin of a mainboard (not shown in the figure) in the terminal 200, the vapor chamber 10 needs to reach specific rigidity, so that the vapor chamber 10 is not likely deformed or damaged. Therefore, when the heat sink 100 is applied to the terminal 200, a specific rigidity requirement may need to be met while the heat dissipation performance is met. Referring to FIG. 5, the rigidity is tested by applying acting force to the heat sink 100 through a rigidity testing device. The rigidity may also be represented according to the following formula: K=P/ΔL. K represents the rigidity, P represents the acting force, and ΔL is a deformation amount. In other words, the rigidity is an acting force required when an object generates a unit deformation amount. The rigidity testing device 400 includes a force-applying part 401, and the force-applying part 401 applies force to the first base plate 12 of the heat sink 100 to test the rigidity of the heat sink 100.

In an implementation, the first area 101 is an area occupied by a circle whose circle center is the central position O of the plate body 121 and whose radius is a preset radius R. The preset radius R is less than half of a width of the plate body 121 in the first direction (the Y direction shown in FIG. 4). The preset radius R of the first area 101 may be a radius of the force-applying part 401, and the first area 101 is a contact area between the first base plate 12 and the force-applying part 401.

Referring to Table 1, Table 1 is comparison between an existing heat sink without a reinforcement table and the heat sink (with the reinforcement table) provided in the first implementation. An existing VC heat sink tested is approximately the same as the heat sink 100 in structure, and a difference lies in that the reinforcement table 127 is convexly disposed on the surface, of the first base plate 12 of the heat sink 100, facing the second base plate 13. Under a same test condition, the rigidity of the vapor chamber is tested. The tested rigidity of the heat sink 100 reaches 2300 lbf/mm, which is far higher than that of the existing VC heat sink.

TABLE 1

Comparison between the existing heat sink without the reinforcement table and the heat sink 100

|  | Existing heat sink | Heat sink 100 |
|---|---|---|
| Rigidity of the vapor chamber | 1800 lbf/mm | 2300 lbf/mm |
| Thickness of the vapor chamber | 4.5 mm | 3.0 mm |
| Height of the heat sink fins | 20.5 mm | 22.0 mm |
| Thickness of the heat sink fins | 25.0 mm | 25.0 mm |

Because the reinforcement table 127 is disposed on the first base plate 12, the reinforcement table 127 may also have relatively good rigidity performance under a relatively small thickness of the vapor chamber 10, so that the vapor chamber 10 can be well applied to the terminal 200 with a relatively small size or with fast heat dissipation. In this implementation, the thickness of the vapor chamber 10 in a stacking direction of the first base plate 12 and the second base plate 13 is 3 mm, and the tested rigidity of the vapor chamber 10 reaches 2300 lbf/mm. In the existing VC heat sink, a thickness range of the vapor chamber is 4.5 mm to 5 mm. When the thickness is 4.5 mm, the rigidity is 1800 lbf/mm, and the rigidity of the heat sink 100 is increased by more than 20%. The reinforcement table 127 is disposed between the first base plate 12 and the second base plate 13, to improve the rigidity of the vapor chamber 10, effectively reduce the thickness of the vapor chamber 10, and effectively reduce occupied space of the vapor chamber 10. In other implementations, the thickness of the vapor chamber 10 in the stacking direction of the first base plate 12 and the second base plate 13 is not greater than 4.5 mm. For example, a thickness range of the vapor chamber 10 in the stacking direction of the first base plate 12 and the second base plate 13 is 2.5 mm to 4.5 mm.

Because the thickness of the vapor chamber 10 is reduced, the height of the heat sink fins 30 can be effectively increased, and the heat dissipation performance of the heat sink 100 can be improved. For example, in the 1 U server, a maximum height of the heat sink is usually limited to 25 mm. Because the thickness of the vapor chamber 10 in the stacking direction of the first base plate 12 and the second base plate 13 is 3 mm, the height of the heat sink fins 30 is 22.0 mm, which is far higher than the height of the heat sink fins (usually 20.5 mm) in the existing VC heat sink. Because the height of the heat sink fins 30 is increased, a heat dissipation area is increased, and the heat dissipation performance of the heat sink 100 is also effectively improved. For example, in a 1288V5 system configured with a 205 W CPU, tested temperature is reduced by about 1.8° C. Compared with the existing heat sink, the heat dissipation performance of the heat sink 100 is improved by 4%.

Figure 6:
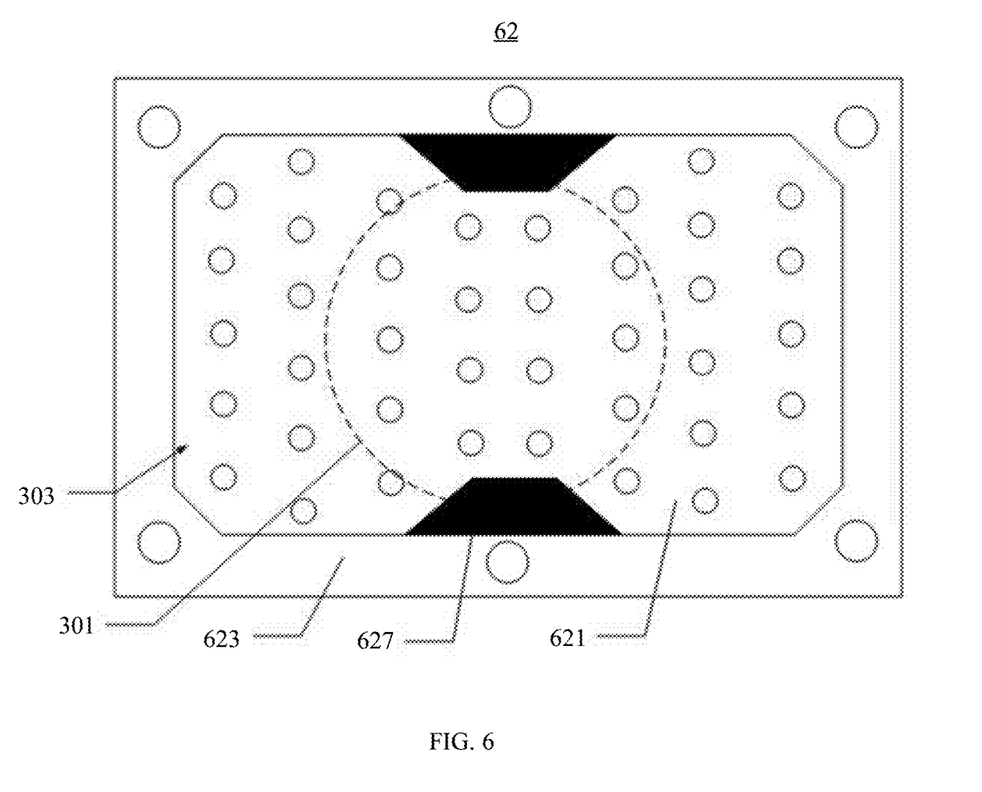
FIG. 6 is a schematic planar diagram of a first base plate of a vapor chamber according to a second implementation.

FIG. 6 is a schematic planar diagram of a first base plate of a vapor chamber according to a second implementation. A structure of the first base plate provided in the second implementation is roughly the same as that of the first base plate provided in the first implementation, and a difference lies in that a reinforcement table 627 is wedge-shaped. The reinforcement table 627 is fastened to an outer frame 623 of the first base plate 62, and a width of the reinforcement table 627 decreases from an end, of the reinforcement table 627, fastened to the outer frame 623 to a center of a plate body 621, to reduce impact on heat circulation in the cavity. The reinforcement table 627 is disposed on a second area 303 and partially extends into a first area 301.

Figure 7:
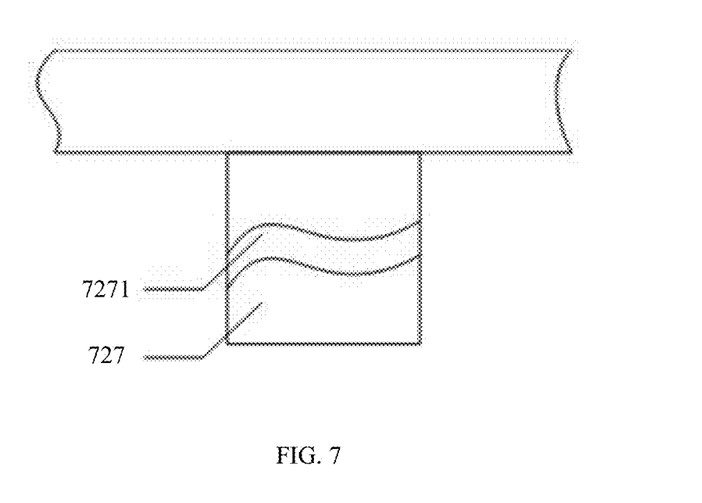
FIG. 7 is a side view of a partial structure of a first base plate of a vapor chamber according to a third implementation.

FIG. 7 is a side view of a partial structure of a first base plate of a vapor chamber according to a third implementation. A structure of the first base plate provided in the third implementation is approximately the same as that of the first base plate provided in the first implementation, and a difference lies in that a groove 7271 is disposed on a reinforcement table 727, and is configured to enable the reinforcement table 727 to have capillary force, to improve a liquid returning capacity of the vapor chamber to the working medium.

Figure 8:
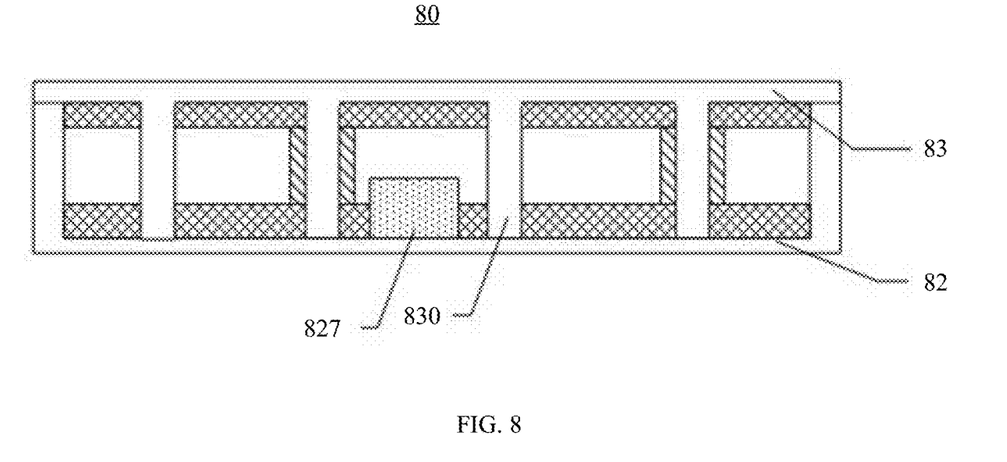
FIG. 8 is a sectional view of a vapor chamber according to a fourth implementation.

FIG. 8 is a sectional view of a vapor chamber according to a fourth implementation. A structure of the vapor chamber 80 provided in the fourth implementation is approximately the same as that of the vapor chamber 10 provided in the first implementation. A reinforcement table 827 is convexly disposed on a surface, of a first base plate 82, facing a second base plate 83. A difference lies in that a support pillar 830 is convexly disposed on a surface, of the second base plate 83, facing the first base plate 82.

Figure 9:
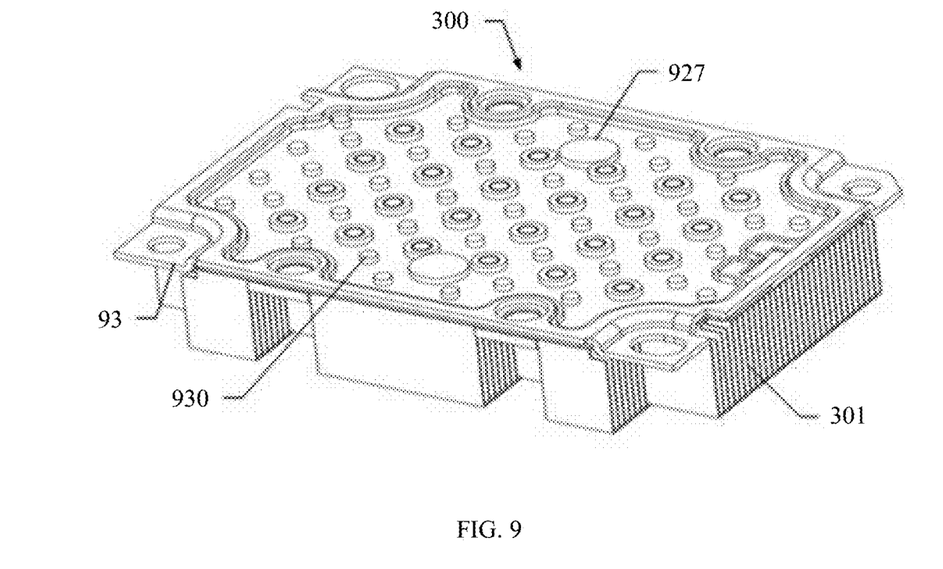
FIG. 9 is a schematic diagram of partial three-dimensional assembly of a heat sink according to a fifth implementation.

FIG. 9 is a schematic diagram of partial three-dimensional assembly of a heat sink according to a fifth implementation. A structure of the heat sink 300 provided in the fifth implementation is approximately the same as that of the heat sink 100 provided in the first implementation. A second base plate 93 is fastened to heat sink fins 301. A difference lies in that a reinforcement table 927 and a plurality of support pillars 930 are convexly disposed on a surface, of the second base plate 93, away from the heat sink fins 301. In other words, the reinforcement table 927 and the plurality of support pillars 930 are convexly disposed on a surface, of the second base plate 93, facing a first base plate (not shown in the figure).

The foregoing descriptions are merely specific implementations, but are not intended to limit the protection scope of the present disclosure. Any variation or replacement readily figured out by a person skilled in the art within the technical scope disclosed shall fall within the protection scope of the present disclosure. Therefore, the protection scope of the present disclosure shall be subject to the protection scope of the claims.

What is claimed is:

1. A vapor chamber comprising:
    a first base plate comprising:
        a plate body comprising an edge and a second surface; and
        an outer frame convexly disposed on and around the edge;
    a second base plate facing the second surface, wherein the first base plate and the second base plate are disposed in a stacked manner, are fastened to each other, and together form a cavity, and wherein the cavity comprises an inner wall and is configured to accommodate a working medium;
    support pillars disposed between the first base plate and the second base plate and convexly disposed on the second surface, wherein the support pillars comprise a first support pillar, and wherein the first support pillar comprises a first surface;
    a capillary structure disposed on the inner wall, disposed on the first surface, and configured to provide a capillary force for returning a liquid to the working medium; and
    a reinforcement table disposed in the cavity, disposed between the first base plate and the second base plate, and convexly disposed on the second surface,
    wherein the reinforcement table is cylindrical, and
    wherein a first diameter of the reinforcement table is greater than a height of the reinforcement table.

2. The vapor chamber of claim 1, wherein the capillary structure is disposed on the second surface.

3. The vapor chamber of claim 2, wherein the plate body extends in a first direction and extends in a second direction that is perpendicular to the first direction, wherein the reinforcement table is located between a central position of the plate body and the outer frame, and wherein the reinforcement table is located on an axis that passes through the central position and extends in the first direction.

4. The vapor chamber of claim 3, wherein the reinforcement table is fastened to the outer frame.

5. The vapor chamber of claim 4, wherein a width of the reinforcement table decreases from an end of the reinforcement table fastened to the outer frame to a center of the plate body.

6. The vapor chamber of claim 1, wherein the first base plate comprises a first area and a second area connected to the first area, wherein the first area is configured to dispose a heat source, wherein the support pillars are distributed on the first area and the second area, and wherein the reinforcement table is distributed on the second area.

7. The vapor chamber of claim 1, wherein the reinforcement table is connected to the first base plate and the second base plate.

8. The vapor chamber of claim 1, wherein a groove is disposed on an outer wall of the reinforcement table.

9. The vapor chamber of claim 1, wherein the capillary structure comprises a first capillary layer, a second capillary layer, and powder rings, wherein the first capillary layer is attached to the second surface, wherein the second capillary layer is attached to a third surface of the second base plate facing the first base plate, and wherein each of the powder rings is sleeved on one of the support pillars.

10. The vapor chamber of claim 9, wherein the support pillars are arranged in columns on the second surface, and wherein in every two adjacent columns of the support pillars the powder rings are sleeved on only one of the columns.

11. The vapor chamber of claim 1, wherein a thickness range of the vapor chamber in a stacking direction of the first base plate and the second base plate is 2.5 millimeters (mm) to 4.5 mm.

12. A heat sink comprising:
a vapor chamber comprising:
    a first base plate comprising:
        a plate body comprising an edge and a second surface; and
        an outer frame convexly disposed on and around the edge,
    a second base plate facing the second surface and comprising a side facing away from the first base plate, wherein the first base plate and the second base plate are disposed in a stacked manner, are fastened to each other, and together form a cavity, and wherein the cavity comprises an inner wall and is configured to accommodate a working medium,
    support pillars disposed between the first base plate and the second base plate and convexly disposed on the second surface, wherein the support pillars comprise a first support pillar, and wherein the first support pillar comprises a first surface,
    a capillary structure disposed on the inner wall, disposed on the first surface, convexly disposed on the second surface, and configured to provide a capillary force for returning a liquid to the working medium, and
    a reinforcement table disposed in the cavity, disposed between the first base plate and the second base plate, and convexly disposed on the second surface, wherein the reinforcement table is cylindrical, and wherein a first diameter of the reinforcement table is greater than a height of the reinforcement table; and
heat sink fins fastened to the side.

13. The heat sink of claim 12, wherein the capillary structure is disposed on the second surface.

14. The heat sink of claim 13, wherein the plate body extends in a first direction and a second direction perpendicular to the first direction, wherein the reinforcement table is located between a central position of the plate body and the outer frame, and wherein the reinforcement table is located on an axis that passes through the central position and extends in the first direction.

15. The heat sink of claim 14, wherein the reinforcement table is fastened to the outer frame.

16. The heat sink of claim 15, wherein a width of the reinforcement table decreases from an end of the reinforcement table fastened to the outer frame to a center of the plate body.

17. The heat sink of claim 12, wherein the first base plate comprises a first area and a second area connected to the first area, wherein the first area is configured to dispose a heat source, wherein the support pillars are distributed on the first area and the second area, and wherein the reinforcement table is distributed on the second area.

18. The heat sink of claim 12, wherein the reinforcement table is connected to the first base plate and the second base plate.

19. A terminal comprising:
a housing;
a heat sink disposed on the housing and comprising:
    a vapor chamber comprising:
        a first base plate comprising:
            a first side;
            a plate body comprising an edge and a second surface; and
            an outer frame convexly disposed on and around the edge;
        a second base plate facing the second surface and comprising a second side facing away from the first side, wherein the first base plate and the second base plate are disposed in a stacked manner, are fastened to each other, and together form a cavity, and wherein the cavity comprises an inner wall and is configured to accommodate a working medium;
        support pillars disposed between the first base plate and the second base plate and convexly disposed on the second surface, wherein the support pillars comprise a first support pillar, and wherein the first support pillar comprises a first surface;
        a capillary structure disposed on the inner wall, disposed on the first surface, and configured to provide a capillary force for returning a liquid to the working medium and
        a reinforcement table disposed in the cavity, disposed between the first base plate and the second base plate, and convexly disposed on the second surface, wherein the reinforcement table is cylindrical, and wherein a first diameter of the reinforcement table is greater than a height of the reinforcement table; and
    heat sink fins fastened to the second side; and
a heat source disposed on the housing and attached to the first side.

20. The terminal of claim 19, wherein the terminal is a server, and wherein the heat source is a chip.

21. The vapor chamber of claim 3, wherein a first size of the reinforcement table along the first direction is larger than second sizes of the support pillars.

22. The vapor chamber of claim 3, wherein the first diameter is greater than second diameters of the support pillars.

23. The vapor chamber of claim 1, wherein the reinforcement table is disposed on an area of the plate body in which stress of the plate body is relatively weak.

24. The vapor chamber of claim 23, wherein the support pillars, the reinforcement table, and the plate body are integrated with each other.

25. The vapor chamber of claim 6, wherein the second area is not configured to dispose the heat source.

26. The vapor chamber of claim 10, wherein the columns are staggered with respect to each other.

* * * * *